(12) United States Patent
Sharma et al.

(10) Patent No.: US 12,376,342 B2
(45) Date of Patent: *Jul. 29, 2025

(54) PASSIVATION LAYERS FOR THIN FILM TRANSISTORS

(71) Applicant: Intel Corporation, Santa Clara, CA (US)

(72) Inventors: Abhishek A. Sharma, Hillsboro, OR (US); Arnab Sen Gupta, Beaverton, OR (US); Travis W. LaJoie, Forest Grove, OR (US); Sarah Atanasov, Beaverton, OR (US); Chieh-Jen Ku, Hillsboro, OR (US); Bernhard Sell, Portland, OR (US); Noriyuki Sato, Hillsboro, OR (US); Van Le, Beaverton, OR (US); Matthew Metz, Portland, OR (US); Hui Jae Yoo, Hillsboro, OR (US); Pei-Hua Wang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/444,520

(22) Filed: Feb. 16, 2024

(65) Prior Publication Data

US 2024/0234579 A1 Jul. 11, 2024

Related U.S. Application Data

(63) Continuation of application No. 16/914,172, filed on Jun. 26, 2020, now Pat. No. 11,955,560.

(51) Int. Cl.
*H01L 29/786* (2006.01)
*H10B 61/00* (2023.01)
(Continued)

(52) U.S. Cl.
CPC ......... *H10D 30/6755* (2025.01); *H10B 61/22* (2023.02); *H10B 63/30* (2023.02); *H10D 99/00* (2025.01)

(58) Field of Classification Search
CPC ......... H01L 21/02365; H01L 21/02167; H01L 21/82382; H01L 21/67201; H01L 29/7869;
(Continued)

(56) References Cited

U.S. PATENT DOCUMENTS 11,424,369 B2  8/2022  Yamazaki et al.
2021/0226062 A1  7/2021  Yamazaki et al.
2021/0408291 A1  12/2021  Sharma et al.

OTHER PUBLICATIONS

Non-Final Office Action from U.S. Appl. No. 16/914,172 notified Jul. 6, 2023, 13 pgs.
(Continued)

*Primary Examiner* — Nikolay K Yushin
(74) *Attorney, Agent, or Firm* — Essential Patents Group, LLP

(57) ABSTRACT

A thin film transistor (TFT) structure includes a gate electrode, a gate dielectric layer on the gate electrode, a channel layer including a semiconductor material with a first polarity on the gate dielectric layer. The TFT structure also includes a multi-layer material stack on the channel layer, opposite the gate dielectric layer, an interlayer dielectric (ILD) material over the multi-layer material stack and beyond a sidewall of the channel layer. The TFT structure further includes source and drain contacts through the interlayer dielectric material, and in contact with the channel layer, where the multi-layer material stack includes a barrier layer including oxygen and a metal in contact with the channel layer, where the barrier layer has a second polarity. A sealant layer is in contact with the barrier layer, where the sealant layer and the ILD have a different composition.

20 Claims, 10 Drawing Sheets

(51) Int. Cl.
*H10B 63/00* (2023.01)
*H10D 30/67* (2025.01)
*H10D 99/00* (2025.01)

(58) Field of Classification Search
CPC . H01L 29/786; H01L 29/66969; H01L 29/66;
H10B 61/22; H10B 61/00; H10B 63/00;
H10B 63/34; H10B 63/20; H10B 63/845;
H10B 63/10; H10B 61/20; H10B 63/30;
H10B 63/82; H10B 63/80; H10B 63/84;
H10N 50/10; H10N 50/85; H10N 70/24;
H10N 70/20; H10N 70/826; H10N 70/00;
H10N 70/8833; H10D 30/6755; H10D
30/6735; H10D 30/40; H10D 30/43;
H10D 99/00
See application file for complete search history.

(56) References Cited

OTHER PUBLICATIONS

Notice of Allowance from U.S. Appl. No. 16/914,172 notified Dec. 1, 2023, 8 pgs.

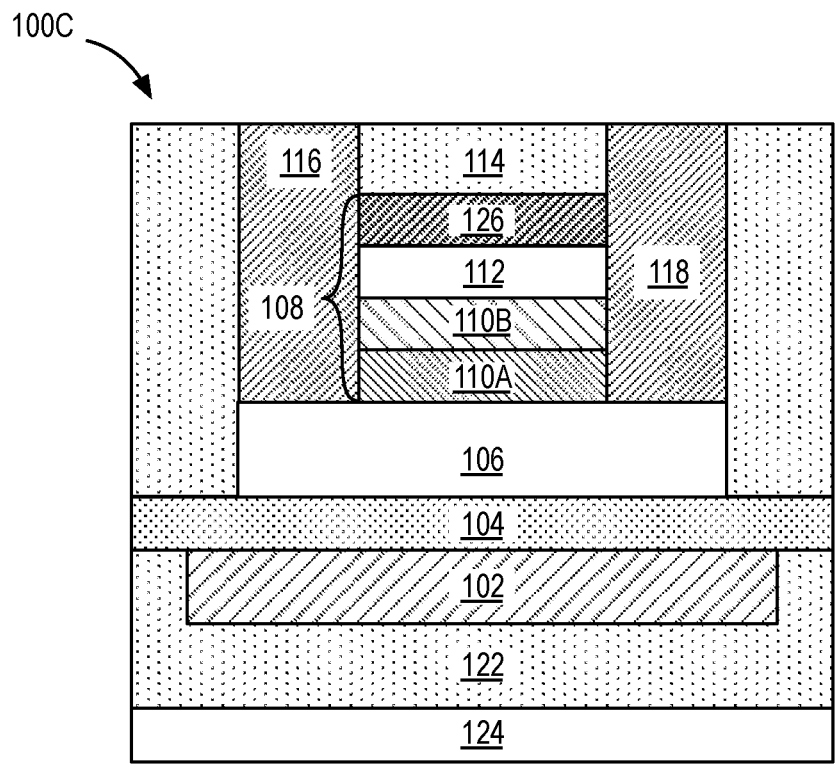
FIG. 1C
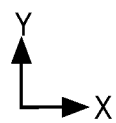

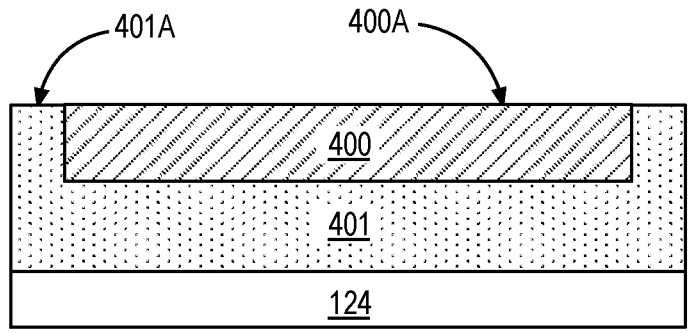
FIG. 4A
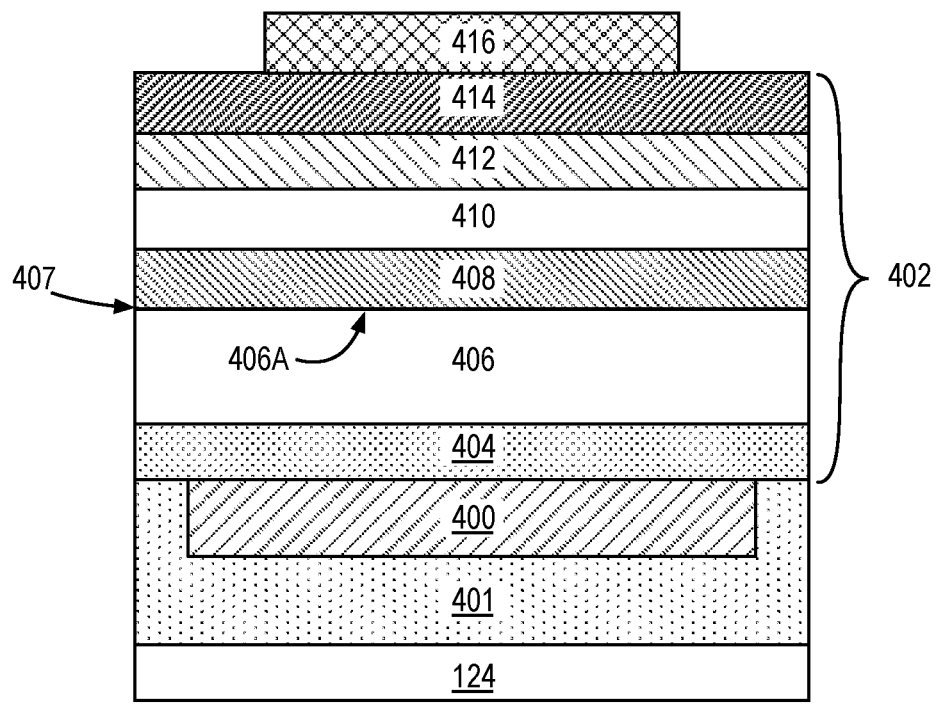
FIG. 4B
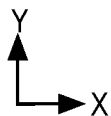

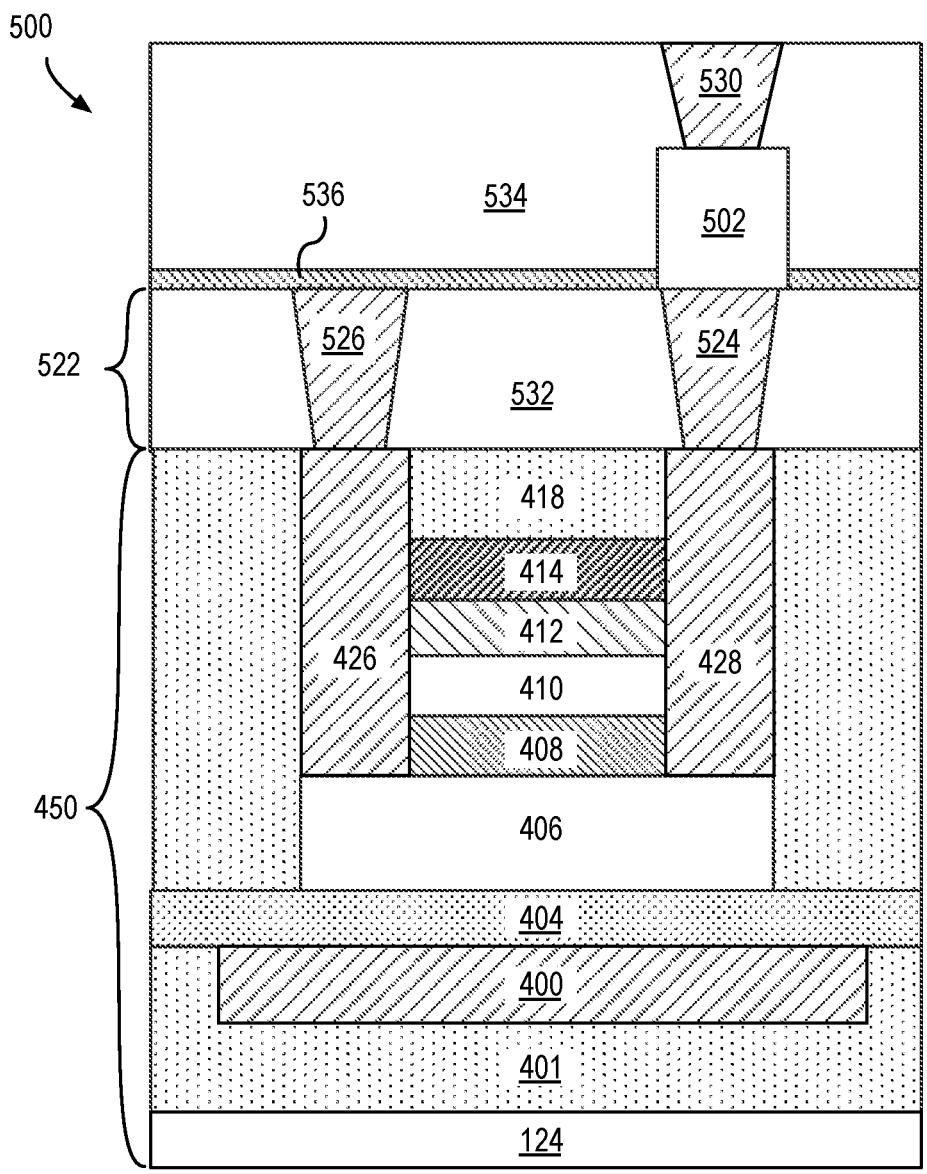
FIG. 5A
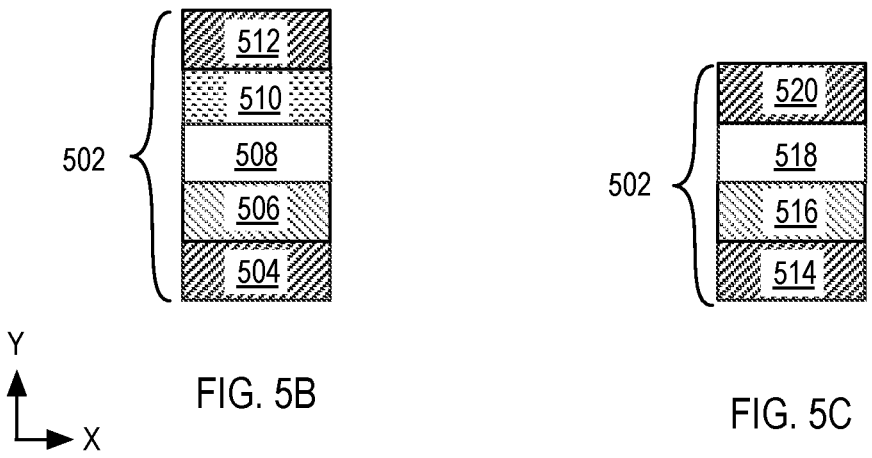
FIG. 5B
FIG. 5C

PASSIVATION LAYERS FOR THIN FILM TRANSISTORS

CLAIM OF PRIORITY

This application is a continuation of, and claims priority to, U.S. patent application Ser. No. 16/914,172, filed on Jun. 26, 2020 and titled "PASSIVATION LAYERS FOR THIN FILM TRANSISTORS AND METHODS OF FABRICATION," which is incorporated by reference herein in its entirety.

BACKGROUND

High performance transistors may utilize materials other than silicon for channel. Such transistors may have limitations for reducing resistance between drain and gate, for example, during operation.

Therefore, there is a continuing need for transistors with reduced off state current and increased drive current in the on state. It is with respect to these and other considerations that the present improvements are needed. Such improvements may become critical as the desire for improved transistor performance becomes more widespread.

BRIEF DESCRIPTION OF THE DRAWINGS

FIG. 1C illustrates a cross-sectional view of a transistor where the multi-layer material stack further includes a dielectric layer, in accordance with an embodiment of the present disclosure.

FIG. 4A illustrates a cross-sectional view of an electrode formed in a dielectric above a substrate, and a gate dielectric layer formed on the electrode.

FIG. 4B illustrates the structure of FIG. 4A following the formation of a material layer stack including a thin film transistor (TFT) channel on the TFT channel, in accordance with an embodiment of the present disclosure.

FIG. 5A illustrates a cross-sectional view of a memory element that includes a resistive random-access memory (RRAM) device.

FIG. 5B is a cross-sectional illustration of a magnetic tunnel junction device, in accordance with an embodiment of the present disclosure.

FIG. 5C is a cross-sectional illustration of a resistive random-access memory device, in accordance with an embodiment of the present disclosure.

DESCRIPTION OF THE EMBODIMENTS

Figure 1A:
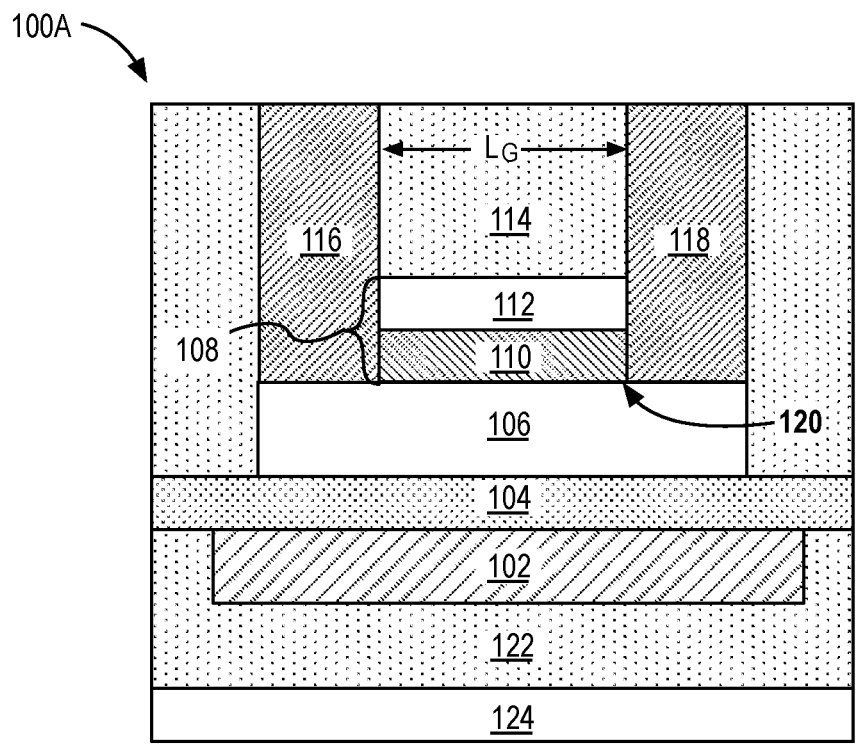
FIG. 1A illustrates a cross-sectional view of a back gated-transistor including a multi-layer material stack having a barrier layer, in accordance with an embodiment of the present disclosure.

Passivation layers for transistors and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Thin film transistors offer substantial flexibility in that they can be fabricated at various levels in an integrated circuit and the orientation of the gate with respect to the source and drain is not as rigid as silicon MOSFET transistors. However, thin film transistor utilize materials that are susceptible to downstream processing such precursors utilized for formation of one or more layers, process temperature excursions, vacuum exposure during annealing at high temperatures, and process gases like hydrogen, nitrogen and oxygen. Some of these issues described above can result in the channel material to be more conductive than desired, resulting in difficulties in gate control (enhanced leakage for example).

TFT devices can be top gated or back-gated for enhanced flexibility, i.e., gate may be above or below a channel layer. For example, unlike silicon MOSFET, the TFT devices are gated on one side of the channel layer and contacted for source and drain on an opposite side. Depending on whether the device is top gated or back gated leakage current between source and drain can be exacerbated. For example, when the device is bottom gated, a bottom surface is in contact with a gate dielectric layer and the side that is opposite to the interface between the channel and the gate dielectric layer is in contact with source and drain metallization structures. The surface (back channel) that is in contact with source and drain metallization may be exposed during fabrication to process conditions that enhance channel degradation. Back channel degradation may result in increased off state leakage (leakage current) and loss of subthreshold slope control.

In addition to back channel degradation, when the channel layer includes indium, gallium and zinc and oxygen, diffusion of oxygen away from the channel layer can lead to instability within the channel. During various fabrication operations, breaking of bonds between oxygen and the various constituents leads to generation of oxygen vacancies within the channel and migration away from the channel. The breaking of bonds is accelerated by incorporation of hydrogen, nitrogen from processing operations as well as through high temperature processes. Thus, preserving the surface opposite to the interface between the gate dielectric layer and the channel is important for device stability.

The inventors have found that some of the processing and device issues may be mitigated by insertion of two or more passivation layers (such as barrier layer, etch stop layer, sealant layer etc) in contact with and in the vicinity of the channel layer. The layers may function as an etch stop layer or as hermetic sealant layer. Such layers may advantageously provide a barrier against oxygen vacancy migration, hydrogen exchange into the channel, damage of the back channel during processing. In some embodiments, one material may be able to advantageously satisfy more than one criteria, however, such material may be difficult to pattern leading to further degradation of channel. By implementing a multilayer stack, where each layer can individual address one or more issues and facilitate patterning to form the transistor device, a thin film transistor may be made more stable.

In addition to processing issues, the inventors have also found that addition of electrical barriers in the vicinity of channel layer can also lead to improvement in device functionality. In some embodiments, the electrical barrier layer is directly in contact with the channel layer During operation of a TFT device, charge accumulation takes place in the vicinity of the gate dielectric (for negative gate biasing). When the gate voltage is turned off charge centroids in the channel move away towards the back channel (away from the gate dielectric) until the channel reaches a fully depleted state. At zero field there is a small amount of net charge near the back channel. Accumulation of free charge in the back channel between the source and drain contacts can lead to leakage between source and drain. An electrical barrier layer implemented at the back channel may be able to repel the charge away from the back channel to prevent source to drain leakage such as through a large potential barrier.

In an embodiment, the electrical barrier layer material may be a p-type material when the channel includes an n-type material, and vice versa. Being of the opposite carrier type, the p-type material (or n type material) and a n-type channel (P-type channel) form a p-n junction and therefore a natural depletion layer. This results in the n-type channel to be depleted which reduces leakage paths that arise in such transistors. Additionally, a p-n junction also provides counter-doping to an already n-doped channel reducing mobile carriers.

While in some embodiments the electrical barrier layer may be in contact with the channel layer, an etch stop layer can be an intervening layer between the channel layer and the electrical barrier layer, if the etch stop layer is sufficiently thin so as to not shield electrostatic effects. In some examples the etch stop layer can be as thin as a monolayer.

The inventors have found an improvement in on current by over 2 decades and a reduction in off state leakage by implementing a passivation layer stack, including a barrier layer, an etch stop layer and a hermetic sealant layer.

In accordance with an embodiment of the present disclosure, a thin film transistor (TFT) structure includes a gate electrode, a gate dielectric layer on the gate electrode, a channel layer on the gate dielectric layer, wherein the channel layer comprises a semiconductor material having a first polarity. The TFT structure further includes a multi-layer material stack on the channel layer, opposite the gate dielectric layer where the multi-layer material stack includes a barrier layer including oxygen and a metal in contact with the channel layer and a sealant layer in contact with the barrier layer. An interlayer dielectric (ILD) material is over the multi-layer material stack and beyond a sidewall of the channel layer, wherein the ILD and the sealant layer have a different composition. The TFT structure further includes a source contact and a drain contact through the interlayer dielectric material. The source and drain contacts are in contact with the channel layer. Depending on embodiments, the barrier layer may include one or more layers.

FIG. 1A is a cross-sectional illustration of a thin film transistor (TFT) structure 100A. In the illustrative embodiment, the TFT structure 100A includes a gate electrode 102, a gate dielectric layer 104 on the gate electrode 102, a channel layer 106 on the gate dielectric layer 104, where the channel layer 106 comprises a semiconductor material with a first polarity. The TFT structure 100A further includes a multi-layer material stack 108 on the channel layer 106, opposite the gate dielectric layer 104 where the multi-layer material stack 108 includes a barrier layer 110 including oxygen and a metal in contact with the channel layer and a sealant layer 112 in contact with the barrier layer 110. The barrier layer has an opposite polarity to the polarity of the semiconductor material. An interlayer dielectric (ILD) material 114 is over the multi-layer material stack 108 and beyond a sidewall of the channel layer 106, wherein the ILD material 114 and the sealant layer 112 have a different composition. The TFT structure 100A further includes a source contact 116 and a drain contact 118 through the ILD material 11. The source contact 116 and drain contacts 118 are in contact with the channel layer 106.

In some embodiments, the channel layer includes an n-type semiconductor material. Examples of channel layer 106 having an n-type semiconductor material include two or more of In, Ga, Zn, Mg, Al, Sn, Hf, O, such as $In_2O_3$, $Ga_2O_3$, ZnO, InGaZnO, InZnO, InGaO, GaZnO, InAlO, InSnO, InMgO, GaZnMgO, GaZnSnO, GaAlZnO, GaAlSnO, HfZnO, HfInZnO, HfAlGaZnO or InMgZnO. In some such embodiments, the barrier layer 110 includes a material that can induce depletion in the channel layer 106 or repel free charges from at an interface 120, between the barrier layer 110 and the channel layer 106. In some such embodiment, the barrier layer includes a material having a complimentary p-type polarity. Examples of p-type material includes $CuO_x$, NbO, NiO, SnO, Cu2O, AgAlO, CuAlO3, AlScOC, Sr3BPO3, La2SiO4Se, LaCuSe, Rb2Sn2O3, La2O2S2, K2Sn2O3, Na2FeOSe2, ZnRh2O4. In further such embodiments, barrier layer 110 includes p-Si, p-SiGe, p-Ge and 2-D materials such as transition metal dichalcogenides for example, $WSe_2$ or MoSe2.

In embodiments an n-type channel layer 106 may be doped with Ti, W, Cu, Mn, Mg, Fe, Hf, Al, Ni, CO or Ru. In embodiments, the channel layer 106 has a dopant concentration between $10^{16}$ and $10^{20}$ atoms/cm$^3$, and wherein the channel comprises a thickness between one monolayer to 80 nm.

In other embodiments, the channel layer 106 includes an p-type material that can induce a depletion layer at interface 120. Examples of channel layer 106 having a p-type semiconductor material include $CuO_x$, NbO, NiO, CoO, SnO, Cu2O, AgAlO, CuAlO3, AlScOC, Sr3BPO3, La2SiO4Se, LaCuSe, Rb2Sn2O3, La2O2S2, K2Sn2O3, Na2FeOSe2 or ZnRh2O4. A combination of depletion region induced by a gate bias and an n-type material for a barrier layer 110 can enhance a depletion state in the transistor 100A. In some such embodiments, the barrier layer 110 includes $In_2O_3$, $Ga_2O_3$, ZnO, InZnO, InGaO, GaZnO, InAlO, InSnO, InMgO, GaZnMgO, GaZnSnO, GaAlZnO, GaAlSnO, HfZnO, HfInZnO, HfAlGaZnO or InMgZnO.

In further such embodiments, barrier layer 110 includes black phosphorus, graphene, carbon nanotube, n-type Si, InGaAs, n-Ge, n-SiGe, InP, or GaN and 2-D materials such as transition metal dichalcogenides, for example, $WS_2$ or $MoS_2$.

In different embodiments, the barrier layer 110 has a thickness that is between a monolayer and 40 nm. As shown the sidewalls of the barrier layer 110 are directly adjacent to the source contact 116 and drain contact 118. As such, the barrier layer 110 has a lateral width that defines a minimum spacing between source and drain contacts 116 and 118, respectively. The minimum spacing between source and drain contacts 116 and 118, respectively, is defined as a gate length, $L_G$, of the TFT structure 100A. In embodiments $L_G$, is between 5 nm and 100 nm.

In the illustrative embodiment, the sealant layer 112 has a same or a substantially same width as the width of the barrier layer 110. As shown the sidewalls of the sealant layer 112 are directly adjacent to the source contact 116 and drain contact 118. Depending on embodiments of the channel layer 106, the sealant layer 112 includes a material such as $Al_2O_3$, AlN, HYO, $SiO_2$, $Y_2O_3$, $HfAlO_X$, $AlSiO_X$, or $AlSiN_X$, SiN, $Ta_2O_3$, $Y_2O_3$, $Ga_2O_3$, $ZrO_2$, HZrO or YZrO. The sealant layer 112 provides protection against hydrogen and nitrogen diffusion into, as well as against oxygen vacancy migration away from a portion of the interface 120 between the source contact 116 and drain contact 118. The sealant layer has a thickness between 3 nm and 5 nm.

In the illustrative embodiment, the ILD 114 includes a material that is sufficient to provide electrical isolation. The ILD 114 includes silicon, carbon and at least one of nitrogen or oxygen. In embodiments, the ILD 114 includes a material that has a lower permittivity than the material of the sealant layer.

The electrode 102 has a lateral width, that is at least equal to a spacing between the source contact 116 and the drain contact 118. In the illustrative embodiment, the electrode 102 is embedded into a dielectric 122 above a substrate 124. The dielectric 122 may include a material that is the same or substantially the same as the material of ILD 114. In embodiments, the substrate 124 may include SiO2, single crystal silicon, germanium or silicon on insulator material.

In embodiments, the source contact 116 and drain contacts 118 include TaN, Ti, TiN, W, Cu, Mo, Au, Ag, Pt, Ru, Ir, ITO, IrOx, TiO2, AZO, doped $In_2O_3$, doped InHfOx, or doped InAlOx.

In embodiments, the gate electrode 102 includes TiN, Ti, Ta, TaN, Ru, Pt, Pd, Ir, IrOx, Carbon, doped In2O3, doped InHfOx, doped InAlOx, SnO, CuO, Cu, Sn, CoO etc.

Figure 1B:
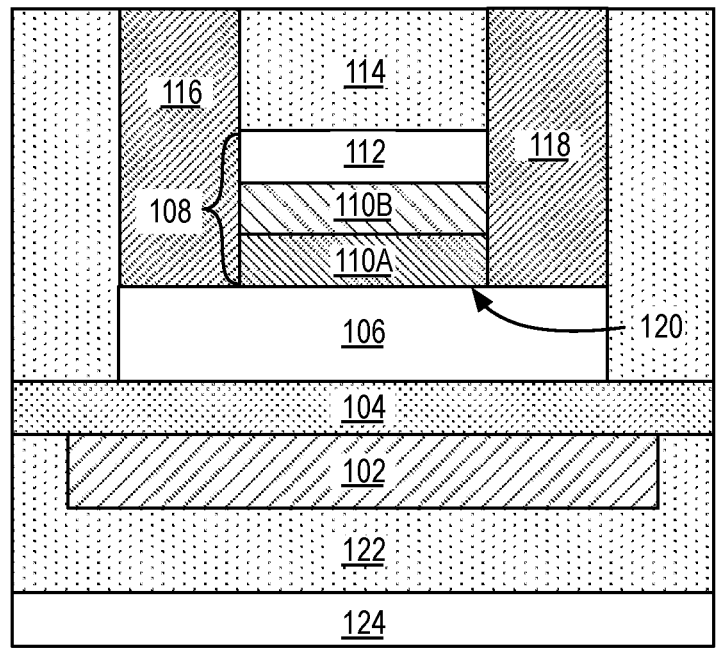
FIG. 1B illustrates a cross-sectional view of a transistor where the barrier layer further includes an etch stop layer, in accordance with an embodiment of the present disclosure.

In some embodiments, the barrier layer 110 includes a plurality of layers such as is illustrated in FIG. 1B. As shown TFT structure 100B include one or more features of the TFT structure 100A. TFT additionally includes a barrier layer 110 that has a first layer 110A and second layer 110B on layer 110A.

In some embodiments, layer 110A includes a material of the barrier layer 110 that is a depletion induction layer. The material of layer 110A will depend on a polarity of the channel layer as discussed above. In some such embodiments, layer 110B is an etch stop layer and includes a material such as $HfO_X$, $ZrO_X$, SiN or AlN. The choice of material for etch stop layer 110B may depend on the material and thickness of layer 110A and on the material and thickness of sealant layer 112. In one such embodiment, etch stop layer 110B and has a thickness between 2 nm and 10 nm.

In embodiments the layer 110A includes a material such as $HfO_X$ or $ZrO_X$ and the layer 110B may include a material of the barrier layer 110 described above. In some such embodiments, the etch stop layer is 110A and has a thickness between 1 monolayer and less than 1 nm, to prevent shielding between layer 110B and the channel layer. A 1 monolayer of $HfO_X$, for example can sufficiently function as an etch stop in some applications.

In an embodiment, etch stop layer 110B and has a thickness between one monolayer and 10 nm.

In other embodiments, layers 110A and 110B both include a material of the barrier layer 110 where layer 110A includes a material that has etch stop properties as well as properties that can induce depletion in the channel layer 106. In some such embodiment, 110B includes a different material from the material of layer 110A but can also induce depletion in the channel layer 106.

In some embodiments, the multi-layered material stack of TFT structure 100B further includes a mask layer 126 on the sealant layer 112, such as is shown in the TFT structure 100C in FIG. 1C. In the illustrative embodiment, the mask layer 126 may be indicative of a processing operation utilized to fabricate transistor comprises a dielectric material different from a material of the sealant and the ILD. In an embodiment, the mask layer 126 includes silicon and oxygen or silicon and nitrogen.

Figure 2:
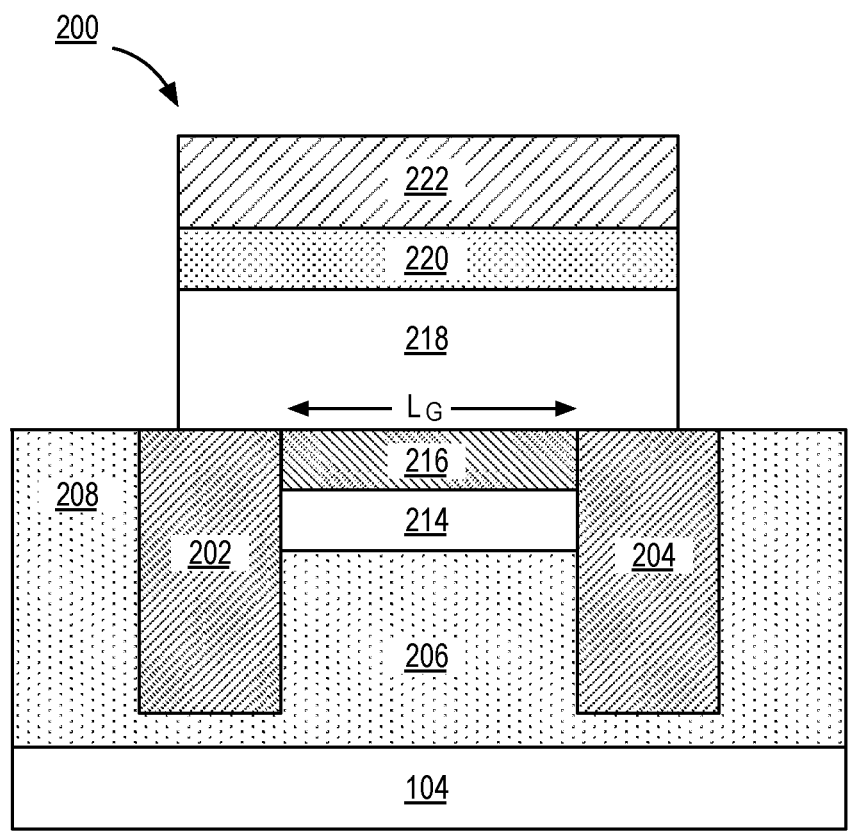
FIG. 2 illustrates a cross-sectional view of a transistor including a gate above a channel passivation layer, in accordance with an embodiment of the present disclosure.

FIG. 2 is a cross-sectional illustration of a TFT structure 200 where a gate electrode is above the source and drain contacts. In the illustrative embodiment, a thin film transistor (TFT) structure 200 includes a first metallization 202 and a second metallization 204 through an ILD 206. The TFT structure 200 further includes a multi-layer material stack 208 between and in contact with the first metallization 210 and second metallization 212, the multi-layer material stack 208 is above the ILD 206. The multi-layer material stack 208 includes a sealant layer 214 in contact with ILD 206, wherein the sealant layer 214 and the ILD 206 have a different composition and a barrier layer 216 comprising oxygen and a metal in contact on the sealant layer 214. A channel layer 218 is on top surfaces of the multi-layer material stack 208 and the metallization structure 202 and the metallization structure 204, wherein the channel layer 218 comprises a semiconductor material, a gate dielectric layer 20 on the channel layer 218, opposite the multi-layer material stack 208 and a gate electrode 222 on the gate dielectric layer 220.

As shown, the transistor 200 has a gate length, $L_G$, that is define by a spacing between the metallization 202 and the metallization 204. The gate electrode 222 may have a lateral width (in X-direction) that is at least equal to or greater than $L_G$.

In embodiments, the barrier layer 216 and the sealant layer 214 includes a material that is the same or substantially the same as the material of the barrier layer 110 and sealant layer 112, respectively, described above. The barrier layer 216 has a thickness that is at least 1 nm. In embodiments, gate dielectric layer 220, gate electrode 222, channel layer 216 each includes a material that is the same or substantially the same as the material of the gate dielectric layer 104, gate electrode 102 and channel layer 106, respectively, described above. In embodiments, the metallization structure 202 and metallization structure 204 each includes a material that is the same or substantially the same as the material of the source contact 116 or the drain contact 118, respectively, described above.

Figure 3:
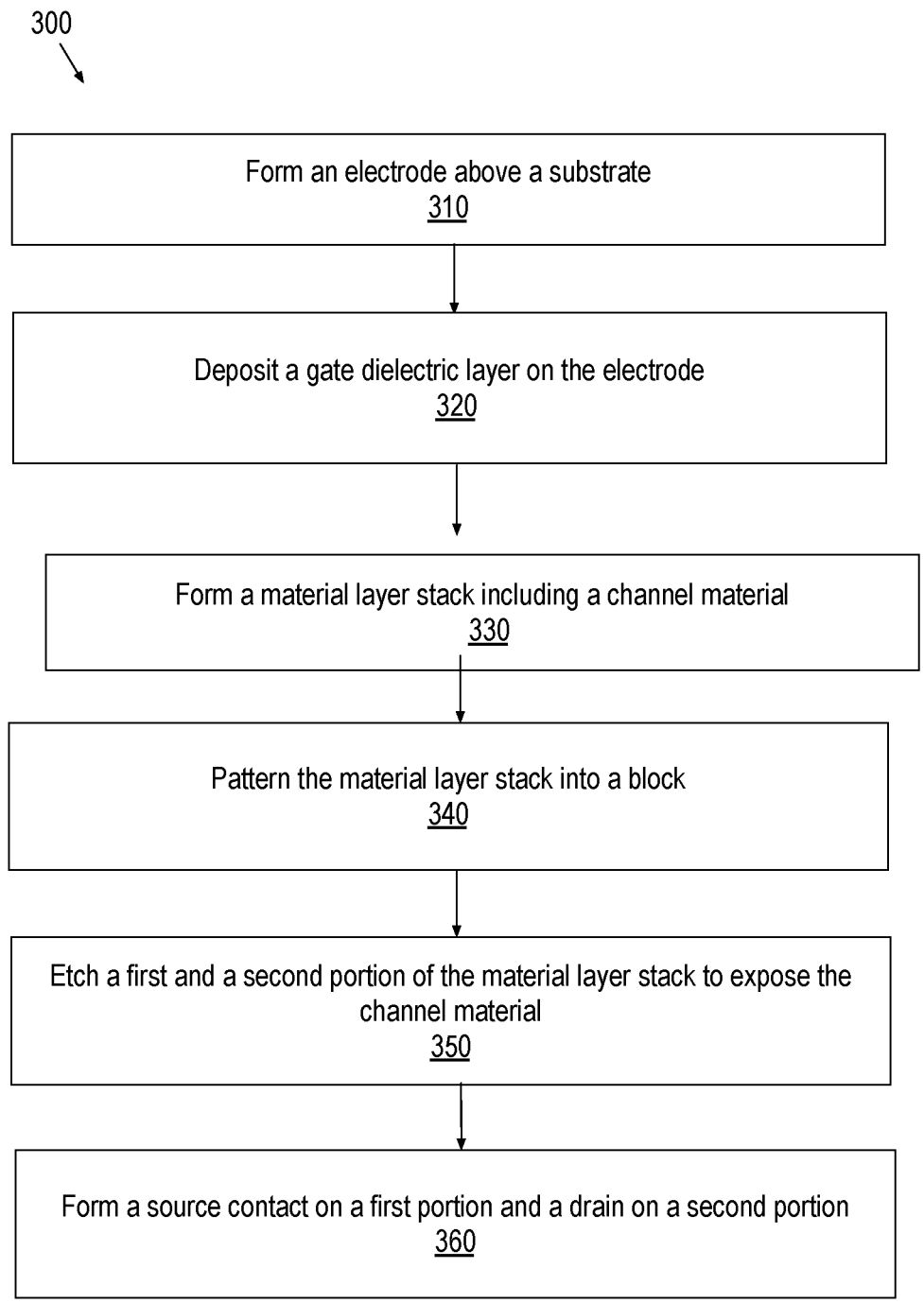
FIG. 3 illustrates a flow diagram for a method to fabricate a transistor with one or more features depicted in FIGS. 1A, in accordance with an embodiment of the present disclosure.

FIG. 3 illustrates a flow diagram for a method 300 to fabricate a transistor with one or more features depicted in FIGS. 1A-1D, in accordance with an embodiment of the present disclosure. The method 300 begins at operation 310 with forming an electrode above a substrate. The method 300 continues at operation 320 with the formation of a gate dielectric layer on the gate electrode. The method 300 continues at operation 330 with the formation of a material layer stack including a channel material. The method 300 continues at operation 340 with the patterning of the material layer stack into a block. The method 300 continues at operation 350 with process to etch a first and a second portion of the block to expose the channel material. The method concludes at operation 360 with the formation of a source contact on a first portion of the channel and a drain contact on a second portion of the channel.

FIG. 4A illustrates a cross-sectional view of a gate electrode 400 formed above a substrate 124. In the illustrative embodiment, the gate electrode is formed in the dielectric 401. In an embodiment, a trench is formed in the dielectric 401 and material of the gate electrode is deposited into the trench and on top surface of the dielectric 401. A planarization process is carried out to remove excess gate electrode material from above the dielectric. In an embodiment, the planarization process includes a chemical mechanical polish (CMP) process. The CMP process forms a gate electrode having substantially planar uppermost surface 400A. As shown the uppermost surface 401A is coplanar or substantially coplanar with an uppermost surface 401A of the dielectric 401. A substantially planar and defect free gate electrode uppermost surface 400A may facilitate defect free deposition of a gate dielectric layer.

FIG. 4B illustrates the structure of FIG. 4A following the formation of a material layer stack 402 for the formation of a thin film transistor such as is depicted in FIG. 1A. In an embodiment, a gate dielectric layer 404 is deposited onto the uppermost surfaces 400A and 401A. In an embodiment, the gate dielectric layer 404 includes a material that is the same or substantially the same as a material of the gate dielectric layer 104. Gate dielectric layer 404 is deposited to a thickness between 0.8 nm and 2 nm. The gate dielectric layer 404 may be deposited by an atomic layer deposition (ALD) process. The ALD process facilitates deposition of an atomically smooth (less than 0.1 nm thickness variation) layer of the gate dielectric layer 404.

The deposition process continues with the formation of a channel layer 406. In an embodiment, the channel layer 406 includes an amorphous or polycrystalline semiconductor. Specific examples of the channel material include indium gallium zinc oxide (IGZO), amorphous InGaZnO (a-IGZO) or crystal-like InGaZnO (c-IGZO). In various embodiments, the channel layer 406 can be doped with n or p-type dopants pre-patterning. In an embodiment, an IGZO channel layer 406 can be doped with Ti, W, Zn, Cu, Mn, Mg, Fe, Al, Hf, Ni, Co or Ru. The channel layer 406 may be deposited to a thickness between 5 nm and 60 nm. A thickness of the IGZO channel layer 406 can affect the field-effect mobility of a transistor to be formed. In embodiments, thickness of the channel layer 406 can exacerbate surface roughness. The channel layer 406 may be deposited by an e-beam evaporation process or by RF magnetron sputtering.

The deposition process is continued with formation of a barrier layer 408. In an embodiment, the deposition process is continued in situ to avoid oxygen absorption on surface 406A. Oxygen absorption of channel layer surface 406A can change characteristics of a depletion layer during transistor operation. In the illustrative embodiment, the barrier layer 408 is deposited on the channel layer 406. In other embodiments, an etch stop layer may be deposited on the channel layer 406 prior to deposition of the barrier layer 408.

The barrier layer 406 may include a material that is dependent on the MOS characteristic of the channel layer. When the channel layer includes a p-type material, the barrier layer is deposited to be an n-type material (and vice versa when the channel layer 406 is n-type material). A non-matching polarity can facilitate a wide possible band offset at an interface 407 between the channel layer 406 and barrier layer 408. In embodiments, the barrier layer 408 includes a material that is the same or substantially the same as the material of the barrier layer 110 described above. The barrier layer 408 may be deposited by a physical vapor deposition, atomic layer deposition, chemical vapor deposition, conversion through metal deposition and oxidation, or through an implantation process. In embodiments, the barrier layer 408 may be deposited to a thickness that depends on the material, where the thickness is between 1 monolayer and 40 nm.

The deposition process is continued with the formation of an etch stop layer 410 on the barrier layer 408. Depending on the material of the etch stop layer 410 the deposition process may include ALD, physical vapor deposition, reactive sputtering, chemical vapor deposition or plasma enhanced physical vapor deposition. In an embodiment, the etch stop layer 410 includes a material that is the same or substantially the same as the material of the etch stop layer 410, described above.

The deposition process is continued with the formation of a sealant layer 412. In an embodiment, the sealant layer 412 includes a $Al_2O_3$, AlN, HYO $SiO_2$, $Y_2O_3$, $HfAlO_X$, $AlSiO_X$, or $AlSiN_X$. The sealant layer can prevent oxygen exchange to surrounding layers and also prevent hydrogen exposure to the interface 407. Depending on the material, the sealant layer may be deposited by reactive evaporation (RE) or activated reactive evaporation (ARE), or ALD, processes.

The material layer stack 402 further includes a mask layer 414. The mask layer 414 includes a material that not only provide resistance to patterning the material layer stack 402 but also against subsequent processing. In an embodiment, the mask layer 414 includes silicon nitride, silicon oxynitride, silicon carbide, silicon dioxide, or carbon doped silicon nitride. The mask layer maybe deposited to a thickness that depends on the material and thickness of the layers below mask layer 414.

In the illustrative embodiment, a lithographic mask 416 is formed on the masking layer 414. In embodiments, the lithographic mask 416 includes a photoresist material that is patterned by lithographic processes to define feature sizes.

Figure 4C:
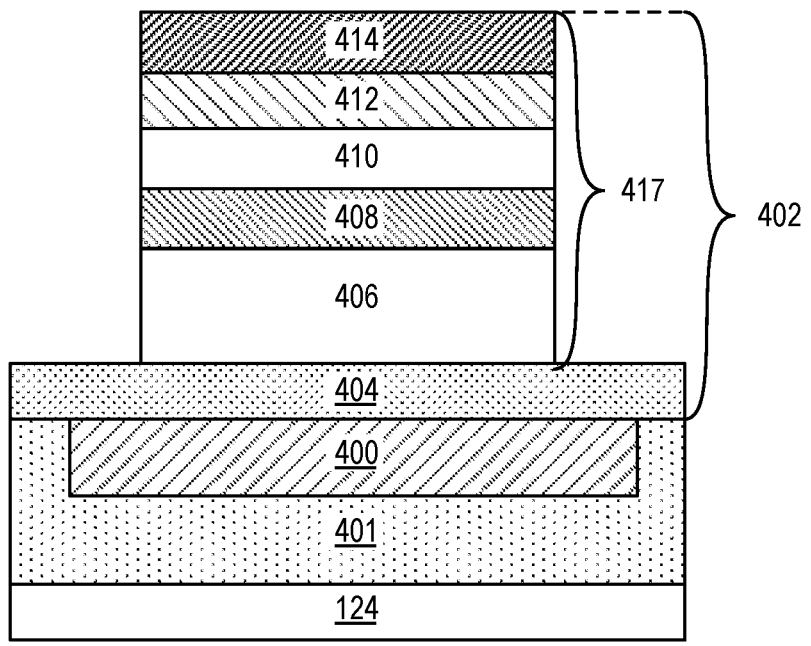
FIG. 4C illustrates the structure of FIG. 4B following the process of patterning the material layer stack to form a patterned stack.

FIG. 4C illustrates the structure of FIG. 4B following the process to etch a plurality of layers in the material layer stack 402. In an embodiment, a plasma etch process is utilized to etch material layer stack 402. In an embodiment, the mask layer 414 is patterned by the plasma etch process and the lithographic mask 416 is removed. Mask layer 414 is utilized to etch the remainder of the material layer stack 402. The etch process etches the sealant layer 412, the etch stop layer 410, the barrier layer 408, and channel layer 406 to form a block 417.

Figure 4D:
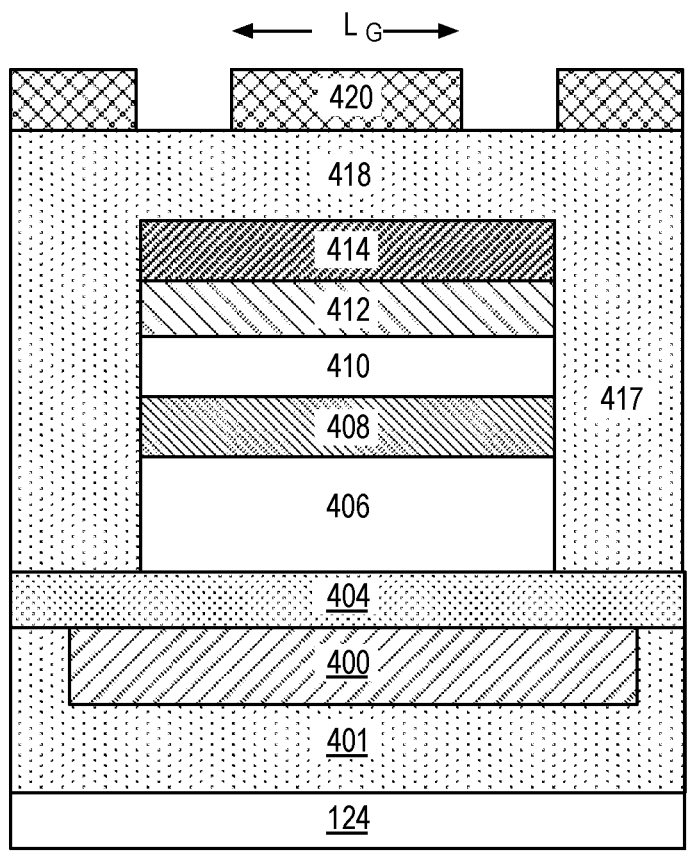
FIG. 4D illustrates a cross-sectional view of the structure of FIG. 4C following the formation of a dielectric layer on the patterned stack and following the formation of a mask on the dielectric layer including a plurality of openings.

FIG. 4D illustrates the structure of FIG. 4C following the process deposition and planarization. In an embodiment, a dielectric 418 is blanket deposited on the surface of the mask layer 414, on sidewalls of the block 417 and on the gate dielectric layer 404. In an embodiment, the dielectric 418 may include a liner layer followed by a bulk dielectric. In other embodiments, the dielectric 418 includes silicon and at least one or more of nitrogen, oxygen or carbon. In some embodiments, the dielectric 418 includes a material that is the same or substantially the same as the material of the mask layer 414.

The dielectric 418 is planarized. In an embodiment, the planarization process includes a chemical mechanical polish (CMP) process that forms a planar top surface 418A. Subsequently, a mask 420 is formed on the top surface 418A. The mask 420 defines the gate length, $L_G$, of the transistor device to be made.

Figure 4E:
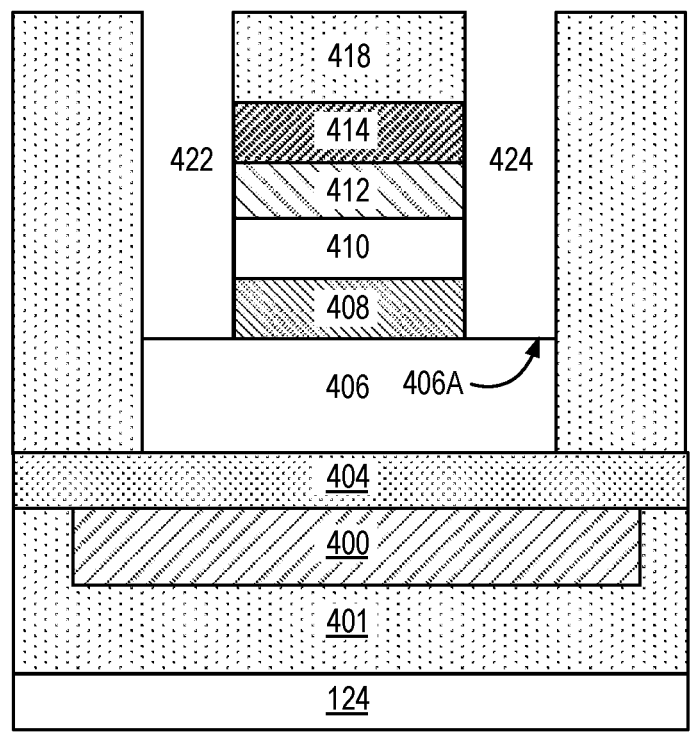
FIG. 4E illustrates the structure of FIG. 4D following the formation of openings in the dielectric layer and etching portions of the patterned block to expose the channel layer.

FIG. 4E illustrates the structure of FIG. 4D following the process to etch the dielectric and portions of the block. In an embodiment, openings in the mask are confined to the block 417. In other embodiments, the opening exposes sidewalls of the block.

In the illustrative embodiment, a plasma etch process is utilized to etch dielectric 418, portions of the mask 414, the sealant layer 412, the etch stop layer 410. The plasma etch chemistry may be altered to etch past the etch stop layer 410 so as to etch the barrier layer 408 with enhanced selectivity with respect to an uppermost surface 406A. The plasma etch process forms openings 422 and 424 as shown. In some embodiments, where the barrier layer 408 is a monolayer or several monolayers thick, the plasma etch process is halted immediately upon detection of the etch stop, preventing rapid etch of the barrier layer 408 and potential etch damage of the channel layer 406.

FIG. 5 illustrates the structure of FIG. 4E following the formation of contact metallization 426 and 428 in the openings 422 and 424, respectively to form transistor 450. In an embodiment, material for contact is deposited into the openings 422 and 424, on the channel surface 406A, on sidewalls of dielectric 418 on uppermost dielectric surface 418A, on sidewalls of mask layer 414, sealant layer 412, etch stop layer 410 and barrier layer 408. In an embodiment, the contact material includes a liner layer and a fill metal on the liner layer. In an embodiment, the liner layer incudes Ti, Ta, TaN, Ru or Al. The fill metal may include a material such as W, Co, Ni or Cu.

After deposition, the material for contact metallization is removed from above the dielectric surface 418A. In an embodiment, a CMP process is utilized to isolate material for contact in the openings 422 and 424 to form contact metallization structures 426 and 428 respectively.

Figure 4F:
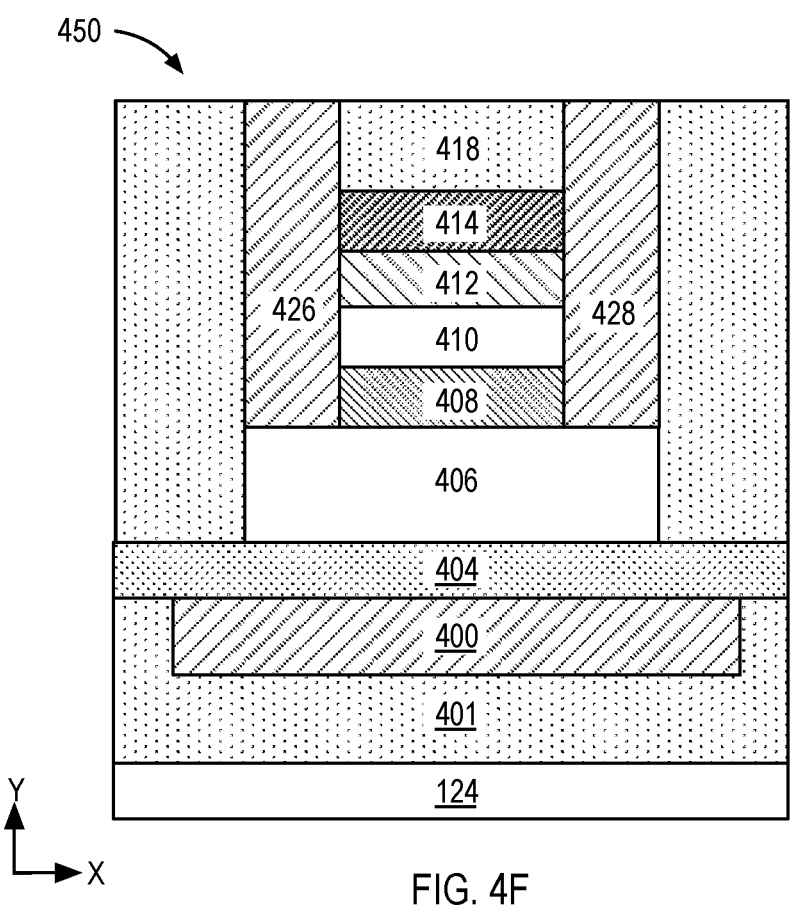
FIG. 4F illustrates the structure of FIG. 4E the formation of a metallization structures on the channel layer in the openings.

FIG. 5A illustrates a cross-sectional view of a memory cell 500 including a TFT transistor structure, such as the transistor 450 (described in association with FIG. 4F) and a non-volatile memory element 502 coupled to a contact of the transistor 450. In the illustrative embodiment, the non-volatile memory element 502 is coupled to the drain contact 428 of the transistor 450.

Non-volatile memory element 502 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 450, which can provide an additional current boost (through increase in drive current), can be advantageously coupled to non-volatile memory element 502 such as an MTJ device to overcome any larger critical switching current requirements.

FIG. 5B illustrates a cross-sectional view of an example non-volatile memory element 502 that includes a magnetic tunnel junction (MTJ) material device. In the illustrated embodiment, the MTJ device includes a bottom electrode 504, a fixed magnet 506 above the bottom electrode 504, a tunnel barrier 508 on the fixed magnet 506, a free magnet 510 on the tunnel barrier 508, and a top electrode 512 on the free magnet 510. In an embodiment, a dielectric spacer laterally surrounds (not shown) non-volatile memory element 502.

In an embodiment, fixed magnet 506 includes a material and has a thickness sufficient for maintaining a fixed magnetization. For example, fixed magnet 506 may include an alloy such as CoFe and CoFeB. In an embodiment, fixed magnet 506 includes $Co_{100-x-y}Fe_xB_y$, where X and Y each represent atomic percent such that X is between 50 and 80 and Y is between 10 and 40, and the sum of X and Y is less than 100. In an embodiment, X is 50 and Y is 20. In an embodiment, fixed magnet 506 is FeB, where the concentration of boron is between 10 and 40 atomic percent of the total composition of the FeB alloy. In an embodiment, the fixed magnet 506 has a thickness that is between 1 nm and 2.5 nm.

In an embodiment, tunnel barrier 508 is composed of a material suitable for allowing electron current having a majority spin to pass through tunnel barrier 508, while impeding, at least to some extent, electron current having a minority spin from passing through tunnel barrier 508. Thus, tunnel barrier 508 (or spin filter layer) may also be referred to as a tunneling layer for electron current of a particular spin orientation. In an embodiment, tunnel barrier 508 includes a material such as, but not limited to, magnesium oxide (MgO) or aluminum oxide ($Al_2O_6$). In an embodiment, tunnel barrier 508 including MgO has a crystal orientation that is (001) and is lattice matched to free magnet 510 below tunnel barrier 508 and fixed magnet 506 above tunnel barrier 508. In an embodiment, tunnel barrier 508 is MgO and has a thickness is between 1 nm to 2 nm.

In an embodiment, free magnet 510 includes a magnetic material such as Co, Ni, Fe or alloys of these materials. In an embodiment, free magnet 510 includes a magnetic material such as FeB, CoFe and CoFeB. In an embodiment, free magnet 510 includes a $Co_{100-x-z}Fe_xB_y$, where X and Y each represent atomic percent such that X is between 50 and 80 and Y is between 10 and 40, and the sum of X and Y is less than 100. In an embodiment, X is 50 and Y is 20. In an embodiment, free magnet 510 is FeB, where the concentration of boron is between 10 and 40 atomic percent of the total composition of the FeB alloy. In an embodiment, free magnet 510 has a thickness that is between 1 nm and 2.0 nm.

In an embodiment, bottom electrode 504 includes an amorphous conductive layer. In an embodiment, bottom electrode 504 is a topographically smooth electrode. In an embodiment, bottom electrode 504 includes a material such as W, Ta, TaN or TiN. In an embodiment, bottom electrode 504 is composed of Ru layers interleaved with Ta layers. In an embodiment, bottom electrode 504 has a thickness between 20 nm and 50 nm. In an embodiment, top electrode 512 includes a material such as W, Ta, TaN or TiN. In an embodiment, top electrode 512 has a thickness between 30 nm and 70 nm. In an embodiment, bottom electrode 504 and top electrode 512 are the same metal such as Ta or TiN. In an embodiment, the MTJ device has a combined total thickness of the individual layers is between 50 nm and 100 nm and a width is between 10 nm and 50 nm.

Referring again to FIG. 6A, in an embodiment, non-volatile memory element 502 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 450, that can provide an additional current boost (through increase in drive current), can be advantageously coupled to an RRAM device to provide reliable switching operation.

FIG. 5C illustrates a cross-sectional view of an example non-volatile memory element 502 that includes a resistive random-access memory (RRAM) device. In the illustrated embodiment, the RRAM material stack includes a bottom electrode 514, a switching layer 516 over the bottom electrode 514, an oxygen exchange layer 518 over the switching layer 516, and a top electrode 520 on the oxygen exchange layer 518.

In an embodiment, bottom electrode 514 includes an amorphous conductive layer. In an embodiment, bottom electrode 514 is a topographically smooth electrode. In an embodiment, bottom electrode 514 includes a material such as W, Ta, TaN or TiN. In an embodiment, bottom electrode 514 is composed of Ru layers interleaved with Ta layers. In an embodiment, bottom electrode 514 has a thickness is between 20 nm and 50 nm. In an embodiment, top electrode 520 includes a material such as W, Ta, TaN or TiN. In an embodiment, top electrode 520 has a thickness is between 50 and 70 nm. In an embodiment, bottom electrode 514 and top electrode 520 are the same metal such as Ta or TiN.

Switching layer 516 may be a metal oxide, for example, including oxygen and atoms of one or more metals, such as, but not limited to Hf, Zr, Ti, Ta or W. In the case of titanium or hafnium, or tantalum with an oxidation state +4, switching layer 516 has a chemical composition, $MO_X$, where O is oxygen and X is or is substantially close to 2. In the case of tantalum with an oxidation state +5, switching layer 516 has a chemical composition, $M_2O_X$, where O is oxygen and X is or is substantially close to 5. In an embodiment, switching layer 516 has a thickness is between 1 nm and 5 nm.

Oxygen exchange layer 518 acts as a source of oxygen vacancy or as a sink for $O^{2-}$. In an embodiment, oxygen exchange layer 518 is composed of a metal such as but not limited to, hafnium, tantalum or titanium. In an embodiment, oxygen exchange layer 518 has a thickness is between 5 nm and 20 nm. In an embodiment, the thickness of oxygen exchange layer 518 is at least twice the thickness of switching layer 516. In another embodiment, the thickness of oxygen exchange layer 518 is at least twice the thickness of switching layer 516. In an embodiment, the RRAM device has a combined total thickness of the individual layers is between 50 nm and 100 nm and width is between 10 nm and 50 nm.

Referring again to FIG. 5A, the memory device 502 is coupled to the transistor 450 through interconnect structures at a level 522 above the transistor. In an embodiment, level 522 includes a single level of interconnects coupled with the transistor 450. In other embodiments, level 522 includes a plurality of sublevels of interconnect routing structures.

In the illustrative embodiment, the memory cell 500 includes a drain interconnect 524 between the memory device 502 and the drain contact 428. As shown, the drain interconnect 524 is on and coupled with the drain contact 428. The memory cell 500 further includes a source interconnect 526 coupled with the source contact 426. In other embodiments, a gate contact (not shown) is coupled to the gate electrode 400. The memory device 502 is further coupled to a memory interconnect 530.

In an embodiment, source interconnect 526 and drain interconnect 524 are embedded in a dielectric layer 532. In an embodiment, the source interconnect 526, drain interconnect 524 and memory interconnect 530 each include titanium, tantalum, tungsten, ruthenium, copper, or nitrides of titanium, tantalum, tungsten, ruthenium. In other embodiments the source interconnect 526, drain interconnect 524 and memory interconnect 530, include a liner layer including ruthenium or tantalum and a fill metal such as copper or tungsten. In the illustrative embodiment, the memory device 502 and the memory interconnect 530 are embedded in a dielectric 534.

In an embodiment, the level 522 further includes a barrier dielectric layer 536 between the dielectric 532 and dielectric 534. In embodiments dielectric 532 and 534 include silicon and one or more of nitrogen, oxygen and carbon such as, silicon nitride, silicon dioxide, carbon doped silicon nitride, silicon oxynitride or silicon carbide.

In embodiments, barrier dielectric layer 536 includes silicon and one or more of nitrogen and carbon such as, silicon nitride, carbon doped silicon nitride or silicon carbide.

Figure 6:
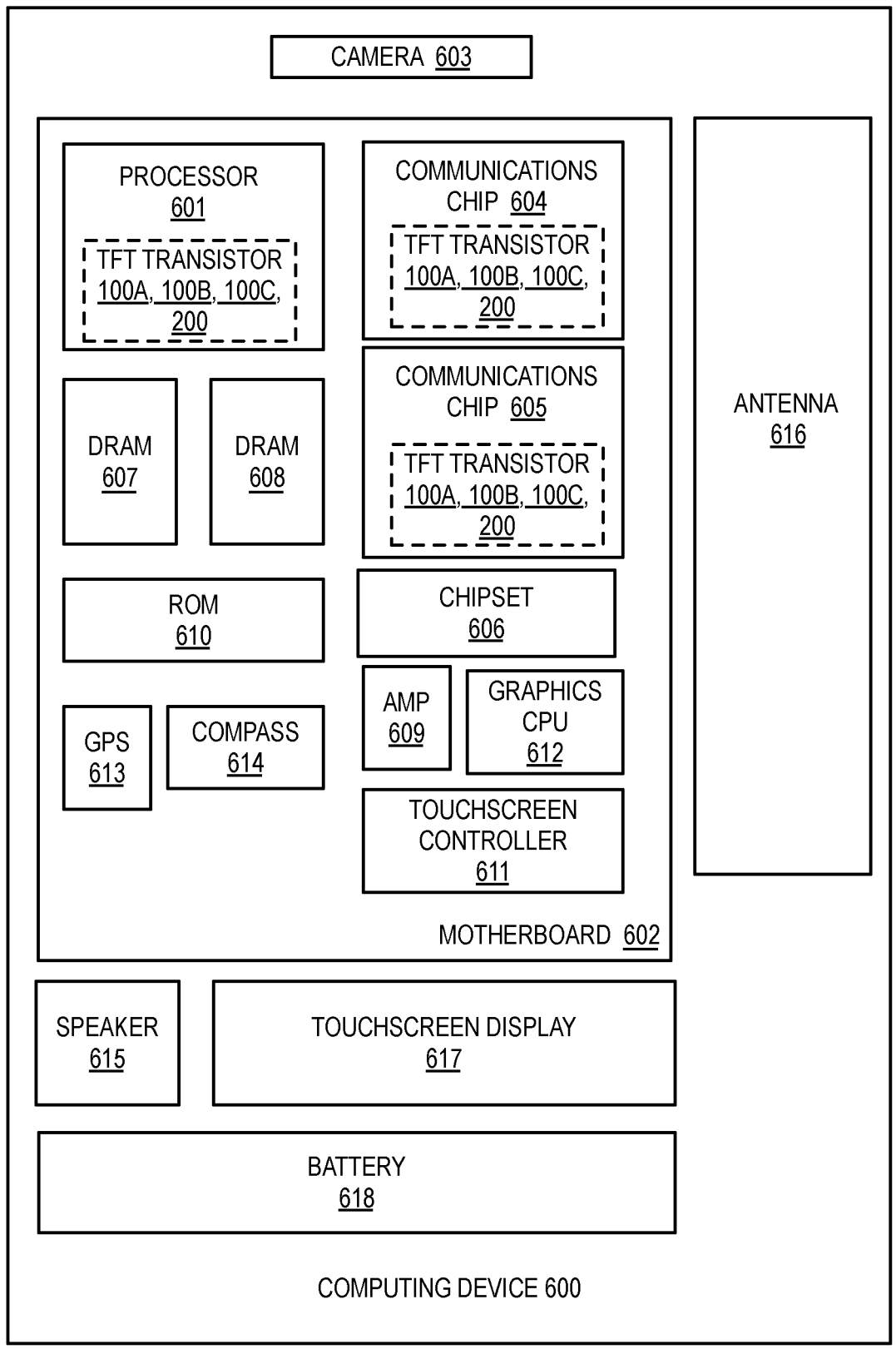
FIG. 6 illustrates a computing device in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communications chip 604 or 605. Processor 601 is physically and electrically coupled to the motherboard 602. In some implementations, communications chip 605 is also physically and electrically coupled to motherboard 602. In further implementations, communications chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 605 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communications chips 604 and 605. For instance, a first communications chip 605 may be dedicated to shorter range wireless communications such as Wi-Fi and Bluetooth and a second communications chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes one or more interconnect structures, non-volatile memory devices, and transistors such as TFT transistors 100A, 100B, 100C or 200 as described in association with FIG. 1A, 1B, 1C or 2, respectively. Referring again to FIG. 6, the term "processor" may refer to any device or portion of a device that processes electronic data from registers and/or memory to transform that electronic data into other electronic data that may be stored in registers and/or memory.

Communications chip 605 also includes an integrated circuit die packaged within communication chip 605. In another embodiment, the integrated circuit die of communications chips 604, 605 includes one or more interconnect structures, non-volatile memory devices, capacitors and transistors such as TFT transistors 100A, 100B,100C or 200 as described in association with FIG. 1A, 1B, 1C or 2, respectively. Referring again to FIG. 6, depending on applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics CPU 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of NVM devices.

In various implementations, the computing device 600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
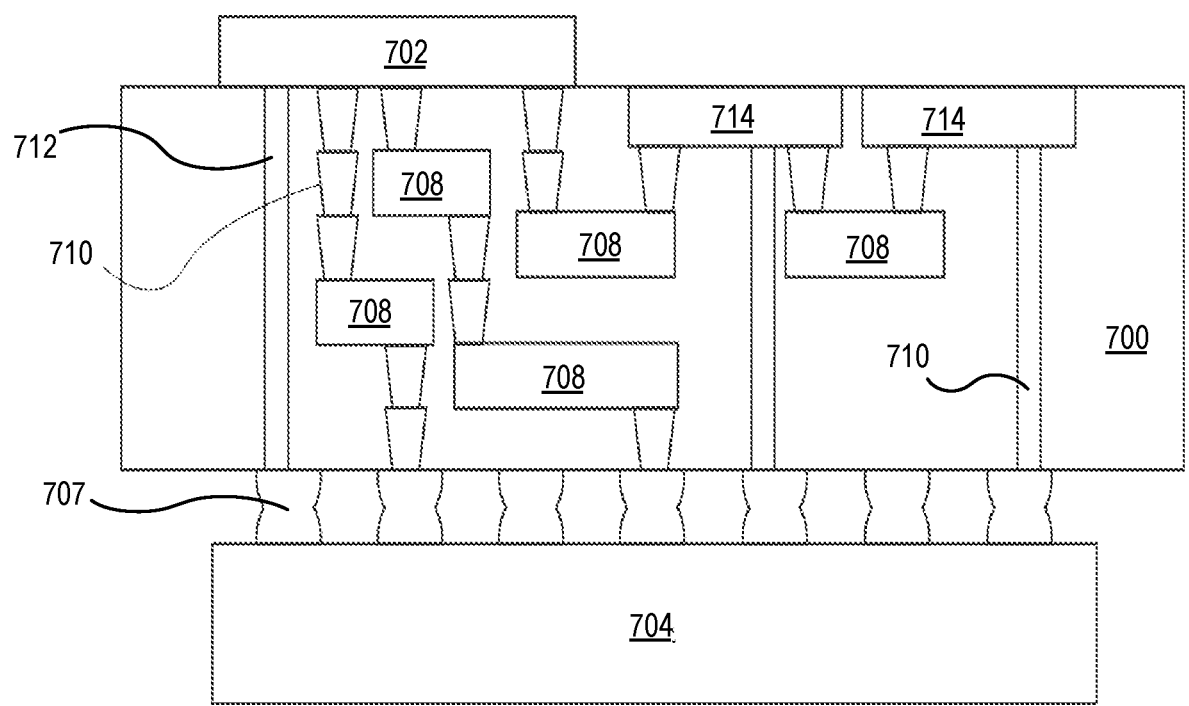
FIG. 7 illustrates an integrated circuit (IC) structure that includes one or more embodiments of the disclosure.

FIG. 7 illustrates an integrated circuit (IC) structure 700 that includes one or more embodiments of the disclosure. The integrated circuit (IC) structure 700 is an intervening substrate used to bridge a first substrate 702 to a second substrate 704. The first substrate 702 may be, for instance, an integrated circuit die. The second substrate 704 may be, for instance, a memory module, a computer mother, or another integrated circuit die. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 707 that can subsequently be coupled to the second substrate 704. In some embodiments, the first substrate 702 and the second substrate 704 are attached to opposing sides of the integrated circuit (IC) structure 700. In other embodiments, the first substrate 702 and the second substrate 704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 708 and vias 710, including but not limited to through-silicon vias (TSVs) 712. The integrated circuit (IC) structure 700 may further include embedded devices 714, including both passive and active devices. Such embedded devices 714 include capacitors, decoupling capacitors, resistors, inductors, fuses, diodes, transformers, device structure including transistors, such as TFT transistors 100A, 100B, 100C or 200 as described in association with FIG. 1A, 1B, 1C or 2, respectively.

Referring again to FIG. 7, the integrated circuit (IC) structure 700 may further include embedded devices 714 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 700.

Thus, one or more embodiments of the present disclosure relate to TFT transistors 100A, 100B,100C or 200 as described in association with FIG. 1A, 1B, 1C or 2, respectively. The TFT transistors 100A, 100B, 100C or 200 may be used in various integrated circuit applications. Accordingly, one or more embodiments of the present disclosure may relate generally to the fabrication of TFT transistors including passivation layers for logic and embedded memory.

In a first example, a thin film transistor (TFT) structure includes a gate electrode, a gate dielectric layer on the gate electrode, a channel layer on the gate dielectric layer, wherein the channel layer includes a semiconductor material with a first polarity, a multi-layer material stack on the channel layer, opposite the gate dielectric layer, an interlayer dielectric (ILD) material over the multi-layer material stack and beyond a sidewall of the channel layer. The TFT structure further includes source and drain contacts through the interlayer dielectric material, and in contact with the channel layer, wherein the multi-layer material stack includes a barrier layer comprising oxygen and a metal in contact with the channel layer, wherein the barrier layer comprises a second polarity and a sealant layer in contact with the barrier layer, wherein the sealant layer and the ILD have a different composition.

In second examples, for any of first examples, the barrier layer includes a p-type polarity and further includes $CuO_x$, NbO, NiO, CoO, SnO, $Cu_2O$, AgAlO, $CuAlO_3$, AlScOC, $Sr_3BPO_3$, $La_2SiO_4Se$, LaCuSe, $Rb_2Sn_2O_3$, $La_2O_2S_2$, $K_2Sn_2O_3$, $Na_2FeOSe_2$, $ZnRh_2O_4$ and wherein the semiconductor material includes an n-type polarity and further includes InZnO, InGaO, GaZnO, InAlO, InSnO, InMgO, GaZnMgO, GaZnSnO, GaAlZnO, GaAlSnO, HfZnO, HfInZnO, HfAlGaZnO, InMgZnO.

In third examples, for any of the first through second examples, the barrier layer includes an n-type polarity and further includes $In_2O_3$, $Ga_2O_3$, ZnO, InZnO, InGaO, GaZnO, InAlO, InSnO, InMgO, GaZnMgO, GaZnSnO, GaAlZnO, GaAlSnO, HfZnO, HfInZnO, HfAlGaZnO or InMgZnO and wherein the semiconductor material includes a p-type polarity and further includes $CuO_x$, NbO, NiO, SnO, $Cu_2O$, AgAlO, $CuAlO_3$, AlScOC, $Sr_3BPO_3$, $La_2SiO_4Se$, LaCuSe, $Rb_2Sn_2O_3$, $La_2O_2S_2$, $K_2Sn_2O_3$, $Na_2FeOSe_2$, $ZnRh_2O_4$.

In fourth examples, for any of the first through third examples, the semiconductor material further includes Ti, W, Cu, Mn, Mg, Fe, Hf, Al, Ni, CO or Ru dopants, wherein the channel layer has a dopant concentration between e16 and e20, and wherein the semiconductor material includes a thickness between 1 monolayer and 80 nm.

In fifth examples, for any of the first through fourth examples, the barrier layer is a depletion induction layer and further wherein the barrier layer includes a thickness between 1 monolayer and 40 nm.

In sixth examples, for any of the first through fifth examples, the sealant layer includes $Al_2O_3$, AlN, HYO, $SiO_2$, $Y_2O_3$, $HfAlO_X$, $AlSiO_X$, or $AlSiN_X$.

In seventh examples, for any of the first through sixth examples, the sealant layer has a higher permittivity than the ILD.

In eighth examples, for any of the first through seventh examples, the sealant layer includes a thickness between 3 nm and 5 nm.

In ninth examples, for any of the first through eighth examples, the barrier layer further includes a first layer including a first metal and oxygen and a second layer on the first layer, wherein the second layer includes a second metal and oxygen.

In tenth examples, for any of the first through ninth examples, the second layer is an etch stop layer and has a thickness between one monolayer and 10 nm.

In eleventh examples, for any of the first through tenth examples, the source and drain contacts are in contact with a sidewall of one of more material layers of the multi-layered material stack.

In twelfth examples, for any of the first through eleventh examples, the multi-layered material stack further includes a mask layer on the sealant layer, wherein the mask layer includes a dielectric material different from a material of the sealant and the ILD.

In thirteenth examples, a system includes a thin film transistor (TFT) structure including a gate electrode, a gate dielectric layer on the gate electrode, a channel layer on the gate dielectric layer, wherein the channel layer includes a semiconductor material with a first polarity. The (TFT) structure further includes a multi-layer material stack on the channel layer, opposite the gate dielectric layer, an interlayer dielectric (ILD) material over the multi-layer material stack and beyond a sidewall of the channel layer. The TFT structure further includes source and drain contacts through the interlayer dielectric material, and in contact with the channel layer, wherein the multi-layer material stack includes a barrier layer comprising oxygen and a metal in contact with the channel layer, wherein the barrier layer comprises a second polarity and a sealant layer in contact with the barrier layer, wherein the sealant layer and the ILD have a different composition and a memory element coupled with the drain contact.

In a fourteenth example, for any of the thirteenth example, the memory element is a magnetic tunnel junction device.

In fifteenth examples, for any of the thirteenth through fourteenth examples, the memory element is a resistive random-access memory device.

In sixteenth examples, method of fabricating a transistor structure includes patterning an electrode material layer to form a gate electrode above a substrate, depositing a gate dielectric layer on the gate electrode and forming a material layer stack on the gate dielectric layer. Forming the material layer stack includes depositing a channel layer on the gate dielectric layer depositing a barrier layer on the channel layer, depositing an etch stop layer on the barrier layer and depositing a sealant layer on the etch stop layer. The method further includes patterning the material layer stack into a block, depositing a dielectric on the block, patterning a plurality of openings in the block and forming metallization structures in the plurality of openings.

In seventeenth examples, for any of the sixteenth examples, patterning the plurality of openings in the block includes depositing a mask layer on the sealant layer and etching the mask layer, sealant layer, etch stop layer and the barrier layer to expose uppermost surface of the channel layer.

In eighteenth examples, for any of the sixteenth through seventeenth examples, forming metallization structures includes depositing one or more metals into the plurality of openings on onto an uppermost surface of the channel layer.

What is claimed is:

1. A transistor structure, comprising:
   a gate electrode;
   a gate insulator over the gate electrode;
   a channel material over the gate insulator, wherein the channel material comprises a first metal and oxygen;
   a material layer in contact with the channel material, opposite the gate insulator, wherein the material layer comprises a second metal absent from the channel material; and
   source and drain contacts coupled with the channel material.

2. The transistor structure of claim 1, wherein the channel material has n-type conductivity and the material layer has p-type conductivity.

3. The transistor structure of claim 1, wherein the channel material has p-type conductivity and the material layer has n-type conductivity.

4. The transistor structure of claim 1, wherein the material layer is a first material layer, and further comprising:
   a second material layer in contact with the first material layer, wherein the second material layer comprises oxygen and at least one of Al, Y, or Hf or comprises nitrogen and Al or Si; and
   a dielectric material layer over the second material layer, wherein the dielectric material layer has a different composition that the second material layer.

5. The transistor structure of claim 1, wherein the first metal is In, Zn, Ga, Al, Sn, Mg, or Hf.

6. The transistor structure of claim 5, wherein the channel material is InZnO, InGaO, GaZnO, InAlO, InSnO, InMgO, GaZnMgO, GaZnSnO, GaAlZnO, GaAlSnO, HfZnO, HfInZnO, HfAlGaZnO, or InMgZnO.

7. The transistor structure of claim 5, wherein the second metal is Cu, Nb, Ni, Co, Sn, Ag, Al, Sc, Sr, La, Na, K, Rb, Fe, Zn, or Rh.

8. The transistor structure of claim 7, wherein the material layer is $CuO_x$, NbO, NiO, CoO, SnO, Cu2O, AgAlO, CuAlO3, AlScOC, Sr3BPO3, La2SiO4Se, LaCuSe, Rb2Sn2O3, La2O2S2, K2Sn2O3, Na2FeOSe2, or ZnRh2O4.

9. The transistor structure of claim 1, wherein the first metal is Cu, Nb, Ni, Co, Sn, Ag, Al, Sc, Sr, La, Na, K, Rb, Fe, Zn, or Rh.

10. The transistor structure of claim 9, wherein the channel material is $CuO_x$, NbO, NiO, CoO, SnO, Cu2O, AgAlO, CuAlO3, AlScOC, Sr3BPO3, La2SiO4Se, LaCuSe, Rb2Sn2O3, La2O2S2, K2Sn2O3, Na2FeOSe2, or ZnRh2O4.

11. The transistor structure of claim 9, wherein the second metal is In, Zn, Ga, Al, Sn, Mg, or Hf.

12. The transistor structure of claim 11, wherein the material layer is InZnO, InGaO, GaZnO, InAlO, InSnO, InMgO, GaZnMgO, GaZnSnO, GaAlZnO, GaAlSnO, HfZnO, HfInZnO, HfAlGaZnO, or InMgZnO.

13. A system comprising:
a transistor structure, comprising:
- a gate electrode;
- a gate insulator over the gate electrode;
- a channel material over the gate insulator, wherein the channel material comprises a first metal and oxygen;
- a multi-layer material stack over the channel material, opposite the gate insulator;
- a dielectric material over the multi-layer material stack; and
- source and drain contacts coupled with the channel material,
- wherein the multi-layer material stack comprises:
  - a first material layer comprising a second metal absent from the channel material; and
  - a second material layer between the first material layer and the dielectric material, wherein the second material layer has a different composition than the dielectric material; and
a memory element coupled with the transistor structure.

14. The system of claim 13, wherein the memory element is a magnetic tunnel junction device or a resistive random-access memory device.

15. The system of claim 13, wherein the channel material has a first conductivity type and the first material layer has a second conductivity type, complementary to the first conductivity type.

16. The system of claim 13, wherein the second material layer comprises oxygen and at least one of Al, Y, Hf or comprises nitrogen and Al or Si, and wherein the dielectric material comprises Si and oxygen.

17. An integrated circuit (IC) comprising a thin film transistor, wherein the thin film transistor comprises:
- a gate insulator over a gate electrode;
- a channel material over the gate insulator, wherein the channel material comprises a first metal and oxygen;
- a multi-layer material stack over the channel material, opposite the gate insulator;
- a dielectric material over the multi-layer material stack; and
- source and drain contacts coupled with the channel material,
  - wherein the multi-layer material stack comprises:
    - a first material layer comprising a second metal absent from the channel material; and
    - a second material layer between the first material layer and the dielectric material, wherein the second material layer has a different composition than the dielectric material.

18. The IC of claim 17, wherein one of the first or second metals is In, Zn, Ga, Al, Sn, Mg, or Hf and another of the first or second metals is Cu, Nb, Ni, Co, Sn, Ag, Al, Sc, Sr, La, Na, K, Rb, Fe, Zn, or Rh.

19. The IC of claim 18, wherein the second material layer comprises oxygen and at least one of Al, Y, or Hf or wherein the second material layer comprises nitrogen and Al or Si.

20. The IC of claim 19, wherein the dielectric material comprises Si and oxygen.

* * * * *